(12) United States Patent
Ankenapalli et al.

(10) Patent No.: US 9,985,616 B2
(45) Date of Patent: *May 29, 2018

(54) PROGRAMMABLE DELAY CIRCUIT INCLUDING HYBRID FIN FIELD EFFECT TRANSISTORS (FINFETS)

(71) Applicant: International Business Machines Corporation, Armonk, NY (US)

(72) Inventors: Vijay K. Ankenapalli, Hyderabad (IN); Ayan Datta, Kolkata (IN); Sumitha George, State College, PA (US); Charudhattan Nagarajan, Bangalore (IN); James D. Warnock, Somers, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/396,847

(22) Filed: Jan. 3, 2017

(65) Prior Publication Data
US 2017/0126218 A1 May 4, 2017

Related U.S. Application Data

(63) Continuation of application No. 14/843,033, filed on Sep. 2, 2015, now Pat. No. 9,614,507, which is a
(Continued)

(51) Int. Cl.
*H03K 5/13* (2014.01)
*H03K 5/134* (2014.01)
(Continued)

(52) U.S. Cl.
CPC ..... *H03K 5/134* (2014.07); *H01L 21/823431* (2013.01); *H01L 21/823475* (2013.01);
(Continued)

(58) Field of Classification Search
CPC ............. H01L 29/785; H01L 29/66818; H01L 27/0886; H01L 27/1211; H01L 27/0808;
(Continued)

(56) References Cited

U.S. PATENT DOCUMENTS 7,795,907 B1 * 9/2010 Wang ................... H01L 27/0924
326/104

OTHER PUBLICATIONS

List of IBM Patents or Patent Applications Treated as Related; (Appendix P), Filed Jan. 13, 2017; 2 pgs.
(Continued)

*Primary Examiner* — John Poos
(74) *Attorney, Agent, or Firm* — Cantor Colburn LLP; Margaret A. McNamara

(57) ABSTRACT

Embodiments relate to programmable delay circuit. An aspect includes a first stage comprising a first hybrid fin field effect transistor (finFET) comprising a first gate corresponding to a first control FET, and a second gate corresponding to a first default FET, and a first plurality of fins, wherein the first gate and the second gate of the first stage each partially control a first shared fin of the first plurality of fins. Another aspect includes a second stage connected in series with the first stage, the second stage comprising a second hybrid finFET comprising a first gate corresponding to a second control FET, and a second gate corresponding to a second default FET, and a second plurality of fins, wherein the first gate and the second gate of the second stage each partially control a second shared fin of the second plurality of fins.

7 Claims, 7 Drawing Sheets

Related U.S. Application Data continuation of application No. 14/794,235, filed on Jul. 8, 2015, now Pat. No. 9,543,935.

(51) Int. Cl.
*H01L 27/088* (2006.01)
*H01L 21/8234* (2006.01)
*H03K 5/00* (2006.01)

(52) U.S. Cl.
CPC .............. *H01L 27/0886* (2013.01); *H03K 2005/00019* (2013.01); *H03K 2005/00221* (2013.01)

(58) Field of Classification Search
CPC . H01L 27/0207; H03K 17/102; H03K 17/122
USPC ............................... 327/147, 536, 538, 566
See application file for complete search history.

(56) References Cited

OTHER PUBLICATIONS

Vijay K. Ankenapalli, et al.,"Programmable Delay Circuit Including Hybrid Fin Field Effect Transistors (FinFETs)," U.S. Appl. No. 14/794,235, filed Jul. 8, 2015.

Vijay K. Ankenapalli, et al.,"Programmable Delay Circuit Including Hybrid Fin Field Effect Transistors (FinFETs)," U.S. Appl. No. 14/843,033, filed Sep. 2, 2015.

* cited by examiner

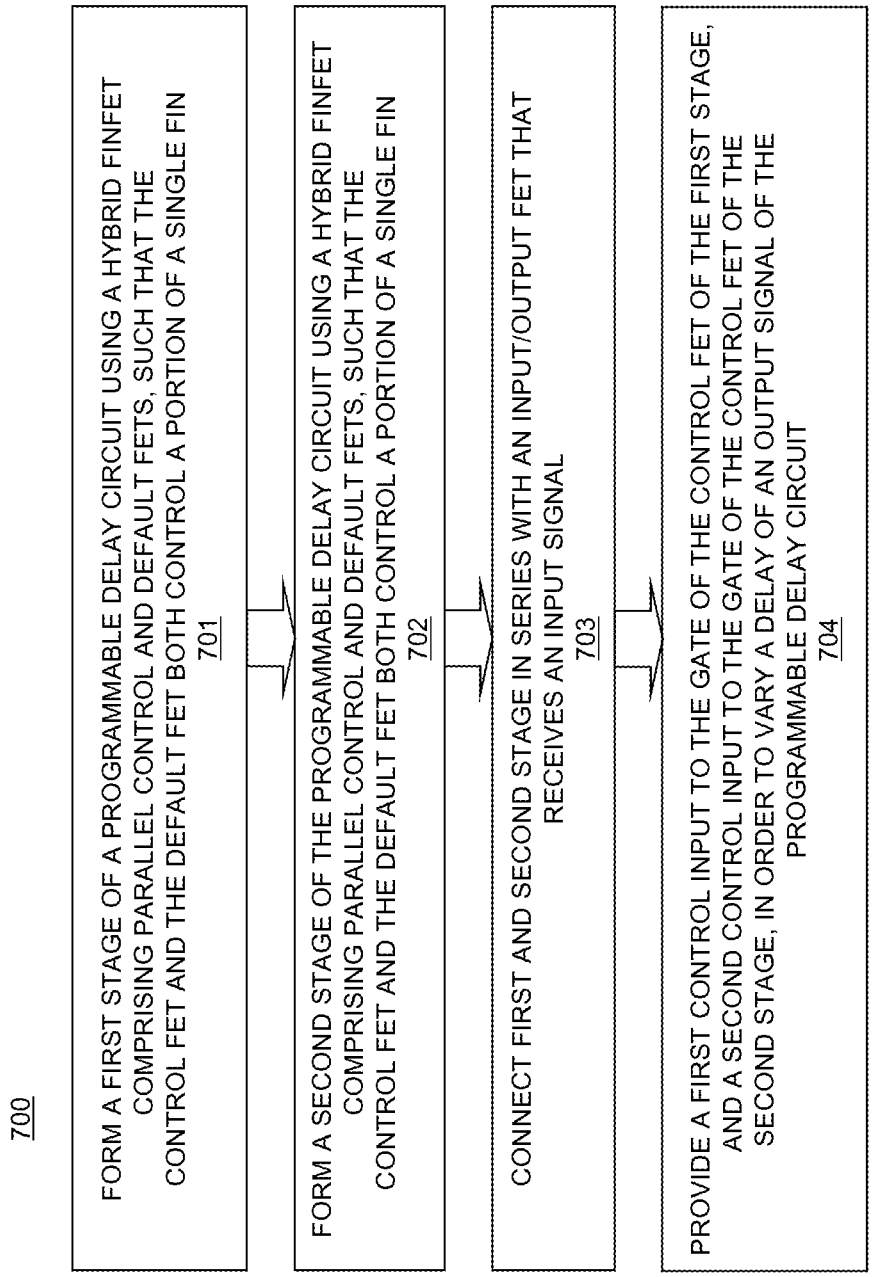

PROGRAMMABLE DELAY CIRCUIT INCLUDING HYBRID FIN FIELD EFFECT TRANSISTORS (FINFETS)

DOMESTIC PRIORITY

This application is a continuation of the legally related U.S. application Ser. No. 14/843,033 filed Sep. 2, 2015; which is a continuation the legally related U.S. application Ser. No. 14/794,235 filed Jul. 8, 2015 the contents of which are incorporated by reference herein in their entirety.

BACKGROUND

The present invention relates generally to programmable delay circuits, and more specifically, to a programmable delay circuit including hybrid fin field effect transistors (finFETs).

In an integrated circuit such as a microprocessor, a programmable delay circuit may be used for debugging and performance tuning, particularly in self-timed circuits such as pulsed Local Clock Buffers (LCBs), array dynamic circuitry, or clock deskewers. LCBs are used for driving local clock signals in microprocessor designs. A programmable delay circuit receives an input signal, which may be a clock signal or a data signal, and outputs a signal having a specified delay based on the input signal and one or more control inputs. The delay of the output signal that is output by the programmable delay circuit may be varied by varying the control inputs.

SUMMARY

Embodiments include a method, system, and computer program product for programmable delay circuit. An aspect includes a first stage comprising a first hybrid fin field effect transistor (finFET), the first hybrid finFET comprising a first gate corresponding to a first control FET, and a second gate corresponding to a first default FET, and a first plurality of fins, wherein the first gate and the second gate of the first stage each partially control a first shared fin of the first plurality of fins. Another aspect includes a second stage connected in series with the first stage, the second stage comprising a second hybrid finFET, the second hybrid finFET comprising a first gate corresponding to a second control FET, and a second gate corresponding to a second default FET, and a second plurality of fins, wherein the first gate and the second gate of the second stage each partially control a second shared fin of the second plurality of fins.

BRIEF DESCRIPTION OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

FIG. 7 depicts a process flow for a programmable delay circuit including hybrid finFETs in accordance with an embodiment.

DETAILED DESCRIPTION

Embodiments of a programmable delay circuit including hybrid finFETs are provided, with exemplary embodiments being discussed below in detail. A programmable delay circuit may include FET devices of various widths and sizes, which may lead to a relatively large and complex circuit layout for the programmable delay circuit, with a relatively large amount of internal wiring. However, implementation of the programmable delay circuit using hybrid finFET technology allows a relatively compact layout for a programmable delay circuit that does not require any additional wire interconnects.

Figure 1:
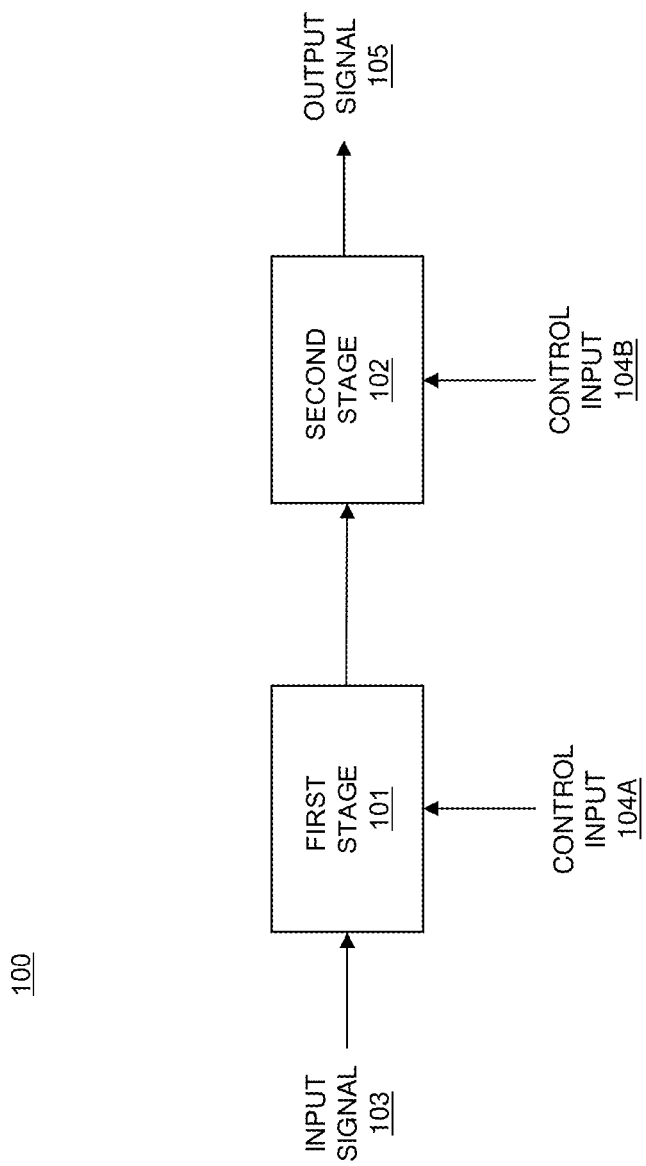
FIG. 1 depicts a block diagram of a programmable delay circuit in accordance with an embodiment.

FIG. 1 illustrates a block diagram of an embodiment of a programmable delay circuit 100. The programmable delay circuit 100 receives an input signals 103, and outputs an output signal 105 having a specified delay based on control inputs 104A-B. Each of control inputs 104A-B may be a binary signal (e.g., 0 or 1) in various embodiments. First stage 101 and second stage 102 each comprise a plurality of parallel FET structures that have various widths that are turned on or off by respective control signals 104A-B; an example of such parallel FET structures is discussed below with respect to FIG. 2. The varying widths of first stage 101 and second stage 102 change the delay in the output signal 105. FIG. 1 is shown for illustrative purposes only; a programmable delay circuit may include any appropriate number and type of circuit components, and may further include any appropriate number of stages and control inputs.

Figure 2:
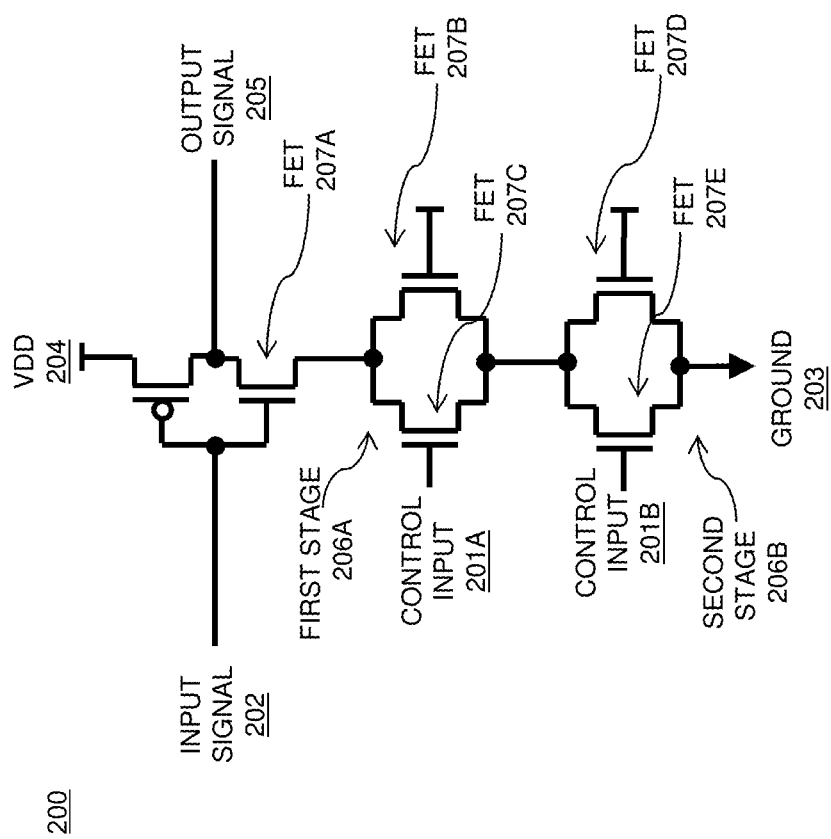
FIG. 2 depicts an example circuit layout of a programmable delay circuit in accordance with an embodiment.

FIG. 2 illustrates an embodiment of a programmable delay circuit 200 that is implemented using n-type FETs (NFETs). Programmable delay circuit 200 includes a connection to a voltage supply rail (VDD) 204, and a connection to ground (GND) 203. When Input Signal 202 switches high current flows from Output Signal 205 to GND 203 via first stage 206A and second stage 206B. First stage 206A includes two parallel NFETs 207B-C. NFET 207B comprises a default FET, with a gate voltage that is tied to VDD (and is therefore always on during operation), and NFET 207C is a control FET that is controlled by first control signal received at control input 201A. Control input 201A turns FET 207C on or off, thereby changing the width of the first stage 206A. Second stage 206B includes two parallel NFETs 207D-E. NFET 207D comprises a default FET, with a gate voltage that is tied to VDD (and is therefore always on during operation), and NFET 207E is a control FET that is controlled by a second control signal received at control input 201B. Control input 201B turns control FET 207E on or off, changing the width of the second stage 206B. Input signal 202 is received by programmable delay circuit 200, and combined with the signal from first stage 206A and second stage 206B to generate output signal 205 via input/output FET 207A. Input/output FET 207A is connected in series with the first stage 206A and second stage 206B. FIG. 2 is shown for illustrative purposes only; a programmable delay structure may include any appropriate number and type of FETs (NFETs or p-type FETs (PFETs)). Further, a programmable delay structure may include any appropriate number of stages and control inputs.

Figure 3:
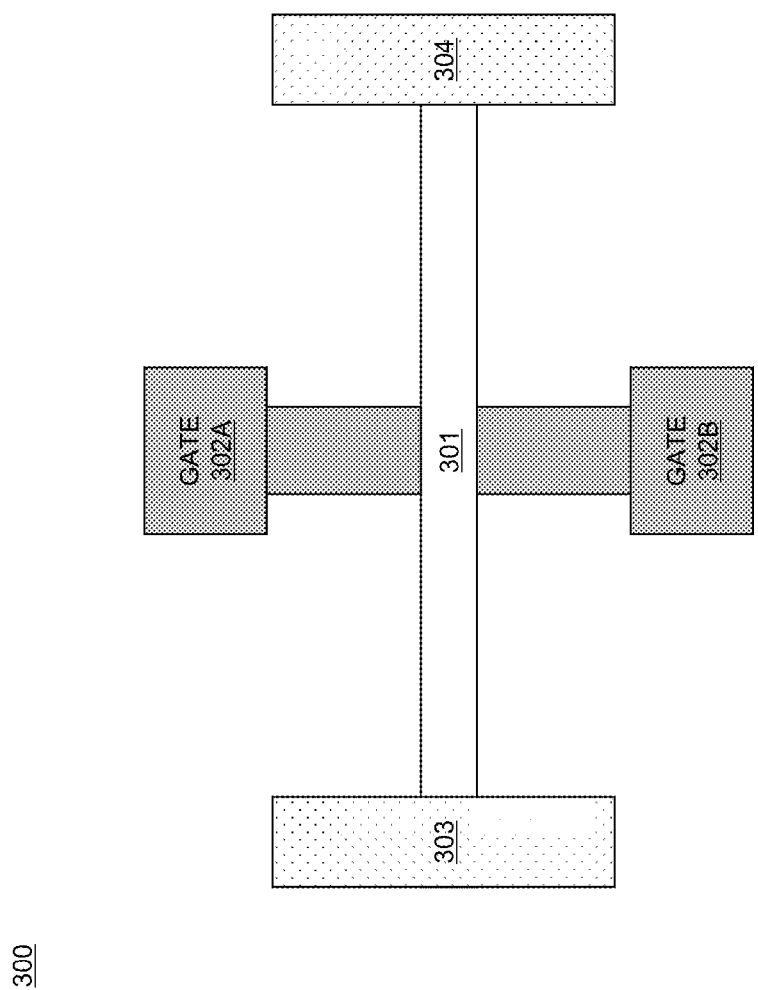
FIG. 3 depicts an insulated, or dual, gate finFET for a programmable delay circuit including hybrid finFETs in accordance with an embodiment.
Figure 4:
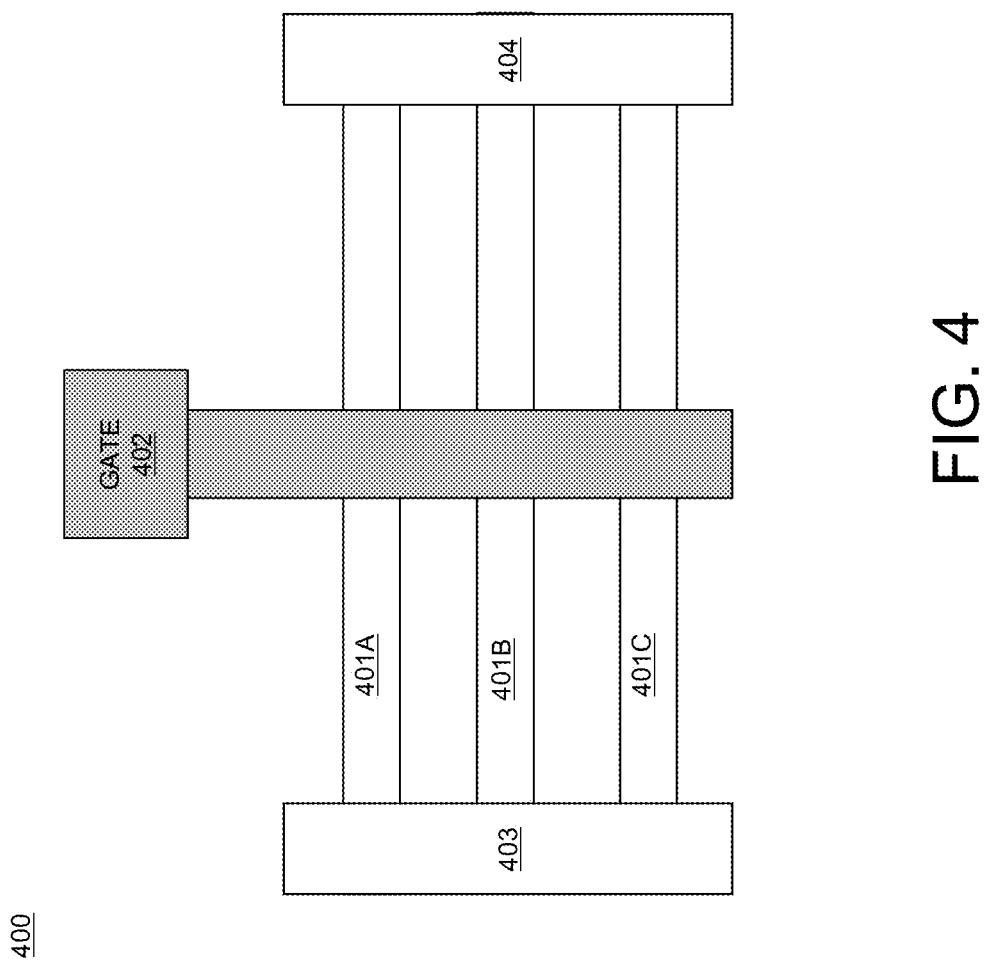
FIG. 4 depicts a trigate finFET for a programmable delay circuit including hybrid finFETs in accordance with an embodiment.

FIG. 3 illustrates an embodiment of an insulated gate, or dual gate, finFET 300. The insulated gate FinFET 300 includes a channel comprising a fin 301 that is located between a source 303 and a drain 304. The fin 301 is a 3-dimensional conductive structure that may be turned off, partially on, or fully on. The channel in the fin 301 is controlled by two gates 302A-B. The flow of current in the finFET 300 may be off in the absence of a gate voltage at both of gates 302A-B, partially turned on by a gate voltage at one of the gates 302A-B, or fully turned on by gate voltages at both of the gates 302A-B, in embodiments in which the finFET 300 is an nFET. In embodiments in which the finFET 300 is a pFET, the devices are turned on when gate voltages are lowered from VDD. The insulated gate FinFET 300 may be used in embodiments of a programmable delay structure. In various embodiments, the fin 301 may comprise a silicon fin, the gates 302A-B may comprise any appropriate metal, combination of metals and/or silicon, and the source 303 and drain 304 may comprise doped silicon, or doped silicon alloyed with other materials. The doping type of the source 303 and drain 304 may be selected based on whether the insulated gate finFET 300 is an NFET or a PFET FIG. 4 illustrates an embodiment of a trigate finFET 400. The trigate finFET 400 includes a channel comprising three fins 401A-C that are each located between a source 403 and a drain 404. The fins 401A-C are 3-dimensional conductive structures that may be turned off or on. The three fins 401A-C are all controlled by a single gate 402. In the absence of a gate voltage in gate 402, the three fins 401A-C are off; in the presence of a gate voltage at gate 402, the three fins 401A-C are turned on in embodiments in which the finFET 300 is an nFET. In embodiments in which the finFET 300 is a pFET, the devices are turned on when gate voltages are lowered from VDD. The trigate FinFET 400 may be used in embodiments of a programmable delay structure. In various embodiments, the fins 401A-C may comprise silicon fins, the gate 402 may comprise any appropriate metal, combination of metals and/or silicon, and the source 403 and drain 404 may comprise doped silicon, or doped silicon alloyed with other materials. The doping type of the source 403 and drain 404 may be selected based on whether the trigate finFET 400 is an NFET or a PFET.

Figure 5:
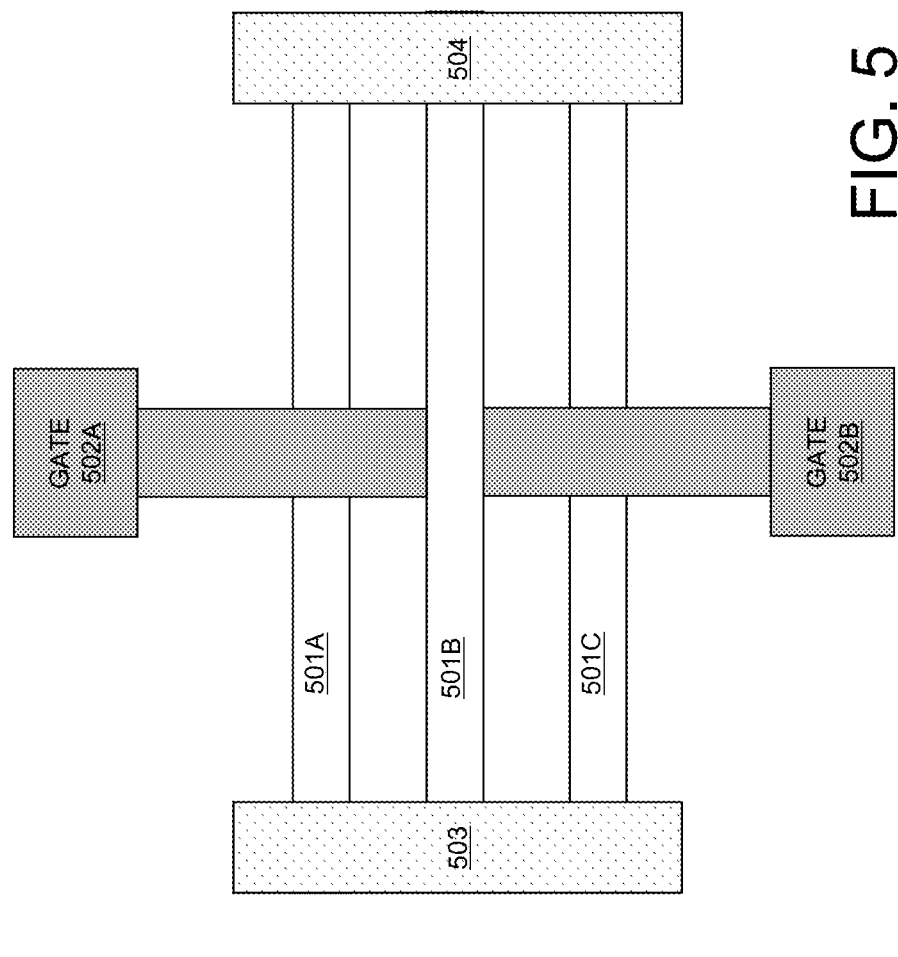
FIG. 5 depicts a hybrid finFET for a programmable delay circuit including hybrid finFETs in accordance with an embodiment.

FIG. 5 illustrates an embodiment of a hybrid finFET 500. The hybrid finFET 500 includes elements corresponding to each of the insulated gate finFET 300 as was shown in FIG. 3, and the trigate finFET 400 that was shown in FIG. 4. The hybrid finFET 500 includes 3 fins 501A-C that are located between a source 503 and a drain 504. The fins 501A-C are 3-dimensional conductive structures that may be turned off, partially on, or fully on. Fin 501A is controlled by only gate 502A. Fin 501B is controlled by both of gates 502A-B. Fin 501C is controlled by only gate 502B. Therefore, a gate voltage at gate 502A turns on fin 501A, and also partially turns on fin 501B in embodiments in which the finFET 300 is an nFET. In embodiments in which the finFET 300 is a pFET, the devices are turned on when gate voltages are lowered from VDD. A gate voltage at gate 502B turns on fin 501C, and also partially turns on fin 501B in embodiments in which the finFET 300 is an nFET. In embodiments in which the finFET 300 is a pFET, the devices are turned on when gate voltages are lowered from VDD. Fin 501B is fully turned on in the presence of gate voltages at both of gates 502A B in embodiments in which the finFET 300 is an nFET. In embodiments in which the finFET 300 is a pFET, the devices are turned on when gate voltages are lowered from VDD. FIG. 5 is shown for illustrative purposes only; for example, in various embodiments of a three fin hybrid finFET, a first gate may only control half of a single fin, and a second gate may control the remaining two and a half fins. Further, a hybrid finFET may have additional, or fewer, fins in any appropriate configuration in various embodiments. In various embodiments, the fins 501A-C may comprise silicon fins, the gates 502A-B may comprise any appropriate metal, combination of metals and/or silicon, and the source 503 and drain 504 may comprise doped silicon, or doped silicon alloyed with other materials. The doping type of the source 503 and drain 504 may be selected based on whether the hybrid finFET 500 is an NFET or a PFET.

Figure 6:
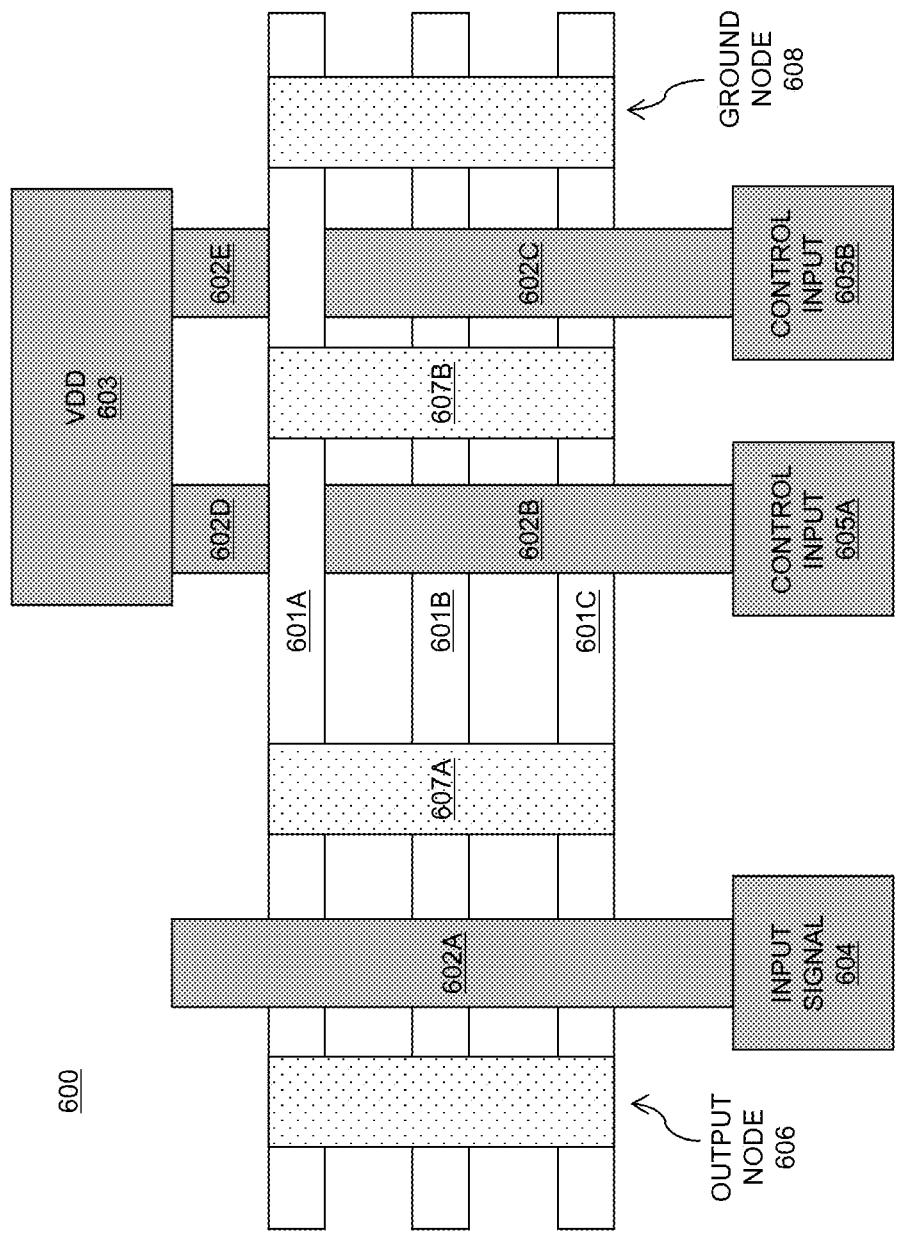
FIG. 6 depicts a programmable delay circuit including hybrid finFETs in accordance with an embodiment.

FIG. 6 depicts an embodiment of the nFET pulldown structure of a programmable delay circuit 600 including hybrid finFETs. Programmable delay circuit 600 includes a supply rail (VDD) connection 603, and a ground node 608. The input signal is received on input signal node 604, and the output signal is output at output node 606. The programmable delay circuit 600 further receives two control inputs 605A-B. The control inputs 605A-B may be binary signals, i.e., may be either on or off. Varying the controls signals received at control inputs 605A-B controls the delay in the output signal at the output node 606. The programmable delay circuit 600 further includes 3 fins 601A-C and source/drain connections 607A-B. The programmable delay circuit 600 includes 5 FETs, each comprising a respective gate 602A-E. Gate 602A corresponds to a trigate finFET (such as is illustrated with respect to FIG. 4) that controls the portion of each of the fins 601A-C located between source/drain connection 607A and output node 606. The FET that comprises gate 602A corresponds to FET 207A of FIG. 2, and comprises an input/output FET. The input signal received at input signal node 604 may turn gate 602A on or off, controlling the conduction of current from the output node 606 through to the source/drain connection 607A, then through each of fins 601A-C to the ground node 608.

The first stage of the programmable delay circuit 600 (which may correspond to first stage 206A of FIG. 2) comprises a single hybrid finFET (such as is illustrated with respect to FIG. 5) and is located between source/drain connections 607A-B. The FET that comprises gate 602B is a control FET that corresponds to FET 207C of FIG. 2, and the FET that comprises gate 602D is a default FET that corresponds to FET 207B of FIG. 2. In the embodiment shown in FIG. 6, the control FET 602B is relatively wide as compared to the default finFET 602D. Control input 605A comprises the gate voltage to gate 602B, while VDD (which is always on during operation) comprises the gate voltage to gate 602D. Gate 602D partially controls fin 601A, and gate 602B fully controls both of fins 601B-C, and partially controls fin 601A. Therefore, when the control input 605A is off, current has a narrow path through the first stage, as fin 601A is only partially on and fins 601B-C are off in between source/drain connections 607A-B. When the control input 605A is on, the current has a wide path through the first stage, as each of fins 601A-C is turned on between the source/drain connections 607A-B.

The second stage of the programmable delay circuit 600 (which may correspond to second stage 206B of FIG. 2) comprises a single hybrid finFET (such as is illustrated with respect to FIG. 5) and is located between source/drain connection 607B and ground node 608. The FET that comprises gate 602C is a control FET that corresponds to FET 207E of FIG. 2, and the FET that comprises gate 602E is a default FET that corresponds to FET 207D of FIG. 2. In the embodiment shown in FIG. 6, the control FET 602C is relatively wide as compared to the default finFET 602E. Control input 605B comprises the gate voltage to gate 602C, while VDD (which is always on during operation) comprises the gate voltage to gate 602E. Gate 602E partially controls fin 601A, and gate 602C fully controls both of fins 601B-C, and partially controls fin 601A. Therefore, when the control input 605B is off, current has a narrow path through the second stage, as fin 601A is only partially on and fins 601B-C are off in between the source/drain connection 607B and ground node 608. When the control input 605B is on, the current has a wide path through the first stage, as each of fins 601A-C is turned on between the source/drain connection 607B and ground node 608.

FIG. 6 is shown for illustrative purposes only; for example, in various embodiments a programmable delay circuit, three fin hybrid finFETs may be used in which the two gates each control one and a half of the fins, as was shown in FIG. 5. Further, a hybrid finFET in a programmable delay circuit may have additional fins in any appropriate configuration in various embodiments. A programmable delay structure may further include any appropriate number and type of FETs (e.g., NFETs or PFETs). Further, a programmable delay structure may include any appropriate number of stages and control inputs in various embodiments. In various embodiments, the fins 601A-C may comprise silicon fins, the gates 602A-E may comprise any appropriate metal, combination of metals and/or silicon, and the output node 606, source/drain connections 607A-B, and ground node 608 may comprise doped silicon, or doped silicon alloyed with other materials. The doping type of the output node 606, source/drain connections 607A-B, and ground node 608 may be selected based on whether various FETs of the programmable delay structure are NFETs or PFETs.

FIG. 7 depicts an embodiment of a method 700 for implementing a programmable delay circuit including hybrid finFETs. In block 701, a first stage of the programmable delay circuit is formed using a single hybrid finFET, such that the default FET and the control FET of the first stage each partially control a single fin of the hybrid finFET. The gate of the default FET of the first stage is connected to VDD, and the gate of the control FET of the first stage comprises a first control signal input. In various embodiments, the control FET and the default FET of the first stage may each exclusively control one or more additional fins of the hybrid finFET that comprises the first stage. In various embodiments, the hybrid finFET of the first stage may comprise NFETs or PFETs. In block 702, a second stage of the programmable delay circuit is formed using a single hybrid finFET, such that the default FET and the control FET of the second stage each partially control a single fin of the hybrid finFET. The gate of the default FET of the second stage is connected to VDD, and the gate of the control FET of the second stage comprises a first control signal input. In various embodiments, the control FET and the default FET of the second stage may each exclusively control one or more additional fins of the hybrid finFET that comprises the second stage. In various embodiments, the hybrid finFET of the second stage may comprise NFETs or PFETs. In block 703, the first stage and the second stage are connected in series with an input/output FET that receives an input signal. Lastly, in block 704, a first control input is provided to the control FET of the first stage, and a second control input is provided to the control FET of the second stage, and the first and second control inputs are varied to vary a delay of an output signal that is output by the input/output FET based on the input signal.

Technical effects and benefits include a relatively compact layout for a programmable delay circuit.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A programmable delay circuit, comprising:
   a first stage comprising a first hybrid fin field effect transistor (finFET), the first hybrid finFET comprising a first gate corresponding to a first control FET, and a second gate corresponding to a first default FET, and a first plurality of fins, wherein the first gate and the second gate of the first stage each partially control a first shared fin of the first plurality of fins;
   a second stage connected in series with the first stage, the second stage comprising a second hybrid finFET, the second hybrid finFET comprising a first gate corresponding to a second control FET, and a second gate corresponding to a second default FET, and a second plurality of fins, wherein the first gate and the second gate of the second stage each partially control a second shared fin of the second plurality of fins, wherein the first control FET receives a first control signal as a gate voltage, and the second control FET receives a second control signal as a gate voltage; and
   an input/output FET that is connected in series with the first stage and the second stage, wherein the input/output FET receives an input signal, and outputs an output signal having a specified delay based on the first control signal and the second control signal.

2. The programmable delay circuit of claim 1, wherein the first default FET and the first control FET are in parallel in the first hybrid finFET, and wherein the second default FET and the second control FET are in parallel in the second hybrid finFET.

3. The programmable delay circuit of claim 1, wherein the input/output FET comprises a trigate finFET comprising three fins.

4. The programmable delay circuit of claim 3, wherein the first plurality of fins and the second plurality of fins each comprise three fins that correspond to the three fins of the trigate finFET.

5. The programmable delay circuit of claim 4, wherein the three fins of the input/output FET are located between an output node and a first source/drain connection; wherein the three fins of the first hybrid finFET are located between the first source/drain connection and a second source/drain connection, and wherein the three fins of the second hybrid finFET is located between the second source/drain connection and a ground node.

6. The programmable delay circuit of claim 1, wherein the first control FET exclusively controls at least two fins of the first plurality of fins, and wherein the second control FET exclusively controls at least two fins of the second plurality of fins.

7. The programmable delay circuit of claim 1, wherein the first plurality of fins and the second plurality of fins each comprise 3-dimensional silicon fins.

* * * * *